(12) United States Patent
Akiyama et al.

(10) Patent No.: US 11,128,277 B2
(45) Date of Patent: Sep. 21, 2021

(54) METHOD FOR PRODUCING COMPOSITE WAFER

(71) Applicant: Shin-Etsu Chemical Co., Ltd., Tokyo (JP)

(72) Inventors: Shoji Akiyama, Gunma (JP); Masayuki Tanno, Gunma (JP); Koji Kato, Gunma (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 346 days.

(21) Appl. No.: 16/094,209

(22) PCT Filed: Apr. 4, 2017

(86) PCT No.: PCT/JP2017/014034
§ 371 (c)(1),
(2) Date: Oct. 17, 2018

(87) PCT Pub. No.: WO2017/187903
PCT Pub. Date: Nov. 2, 2017

(65) Prior Publication Data
US 2019/0097596 A1    Mar. 28, 2019

(30) Foreign Application Priority Data

Apr. 28, 2016    (JP) .............................. JP2016-090755

(51) Int. Cl.
*H03H 3/08*    (2006.01)
*H01L 21/02*    (2006.01)
(Continued)

(52) U.S. Cl.
CPC ......... *H03H 3/08* (2013.01); *H01L 21/02002* (2013.01); *H01L 21/2007* (2013.01);
(Continued)

(58) Field of Classification Search
CPC .. H03H 3/08; H03H 9/02559; H03H 9/02574; B32B 2310/0875; B32B 38/0008; Y10T 156/10
See application file for complete search history.

(56) References Cited

U.S. PATENT DOCUMENTS 4,983,251 A * 1/1991 Haisma ............... H01L 21/2007
148/DIG. 12
2002/0092823 A1 * 7/2002 Gill ......................... G02F 1/035
216/24
(Continued)

FOREIGN PATENT DOCUMENTS

JP    2003-17967 A    1/2003
JP    2015-227277 A    12/2015
(Continued)

OTHER PUBLICATIONS

Machine Translation PCT WO 2013/135886, Date Unknown.*
(Continued)

*Primary Examiner* — Jeffry H Aftergut
(74) *Attorney, Agent, or Firm* — Hauptman Ham, LLP (57) ABSTRACT

To provide a method for producing a composite wafer capable of reducing a spurious arising by reflection of an incident signal on a joint interface between a lithium tantalate film and a supporting substrate, in the composite wafer including a supporting substrate having a low coefficient of thermal expansion, and a lithium tantalate film having a high coefficient of thermal expansion stacked on the supporting substrate. The method for producing a composite wafer is a method for producing a composite wafer that produces a composite wafer by bonding a lithium tantalate wafer having a high coefficient of thermal expansion to a supporting wafer having a low coefficient of thermal expansion, wherein prior to bonding together, ions are implanted from a bonding (Continued)

surface of the lithium tantalate wafer and/or the supporting wafer, to disturb crystallinity near the respective bonding surfaces.

16 Claims, 8 Drawing Sheets

(51) Int. Cl.
    *H01L 21/762*    (2006.01)
    *H01L 21/20*     (2006.01)
    *H03H 9/02*      (2006.01)
    *B32B 38/00*     (2006.01)

(52) U.S. Cl.
    CPC ... *H01L 21/76256* (2013.01); *H03H 9/02559* (2013.01); *H03H 9/02574* (2013.01); *B32B 38/0008* (2013.01); *B32B 2310/0875* (2013.01); *Y10T 156/10* (2015.01)

(56) References Cited

U.S. PATENT DOCUMENTS

| | | | |
|---|---|---|---|
| 2003/0199105 A1* | 10/2003 | Kub | H01L 27/20 438/3 |
| 2006/0090691 A1 | 5/2006 | Ho et al. | |
| 2008/0064182 A1 | 3/2008 | Hebras | |
| 2011/0227068 A1* | 9/2011 | Akiyama | H01L 21/76254 257/43 |
| 2014/0113434 A1 | 4/2014 | Tauzin et al. | |
| 2014/0187020 A1 | 7/2014 | Libbert et al. | |
| 2018/0175283 A1* | 6/2018 | Akiyama | C30B 31/22 |

FOREIGN PATENT DOCUMENTS

| | | |
|---|---|---|
| JP | 2016-508291 A | 3/2016 |
| TW | 200606996 A | 2/2006 |
| TW | 200822193 A | 5/2008 |
| WO | WO-2009/106177 A2 * | 9/2009 |
| WO | WO-2013/135886 A1 * | 9/2013 |
| WO | WO-2016/194975 A1 * | 12/2016 |

OTHER PUBLICATIONS

Poberaj, G. et al "Ion-sliced lithium niobate thin films for active photonic devices", Optical Materials 31 (2009) pp. 1054-1058.*

Rabiei, P, et al, "Optical and electro-optical properties of submicrometer lithium niobate slab waveguides prepared by crystal ion slicing and wafer bonding", Applied Physics Letters, vol. 85, No. 20, Nov. 12, 2004, pp. 4603-4605.*

Office Action in TW Application No. 106114122, dated May 8, 2020, 9pp.

Extended European Search Report in EP Application No. 17789191.8, dated Aug. 16, 2019, 7pp.

Taiyo Yuuden Co., Ltd., "Temperature Compensation Technology for SAW-Duplexer used in RF front end of smartphone", Dempa Shimbun High Technology, Nov. 8, 2012, Searched on Mar. 20, 2015 from Internet URL: http://www.yuden.co.jp/jp/product/tech/column/20121108.html, Japan, 10pp.

H. Kobayashi et al., "A Study on Temperature-Compensated Hybrid Substrates for Surface Acoustic Wave Filters", IEEE International Ultrasonic Symposium Proceedings, 2010, vol. 1, p. 637-640, 4pp.

International Search Report in PCT/JP2017/014034, dated Jun. 27, 2017, 8pp.

Written Opinion of the ISA in PCT/JP2017/014034, dated Jun. 27, 2017, 13pp.

* cited by examiner

METHOD FOR PRODUCING COMPOSITE WAFER

RELATED APPLICATIONS

The present application is a National Phase of International Application No. PCT/JP2017/014034, filed Apr. 4, 2017 and claims priority of Japanese Patent Application No. 2016-090755, filed Apr. 28, 2016.

TECHNICAL FIELD

The present invention relates to a method for producing a composite wafer that is used as a material of a surface acoustic wave device or the like.

BACKGROUND ART

In recent years, communication traffic has significantly increased in the market of mobile communications typified by smartphones. In association with increasing the number of required bands for addressing this problem, minimization and improved performance have become essential for diverse components. Lithium tantalate (LT) and lithium niobate (LN) that are general piezoelectric materials are widely used as materials of surface acoustic wave (SAW) devices. While these materials have large electromechanical coupling coefficients and can broaden the bandwidth, they are low in temperature stability, and have the problem that the acceptable frequency shifts as the temperature varies. This is attributed to the fact that lithium tantalate and lithium niobate have very high coefficients of thermal expansion.

Figure 12:
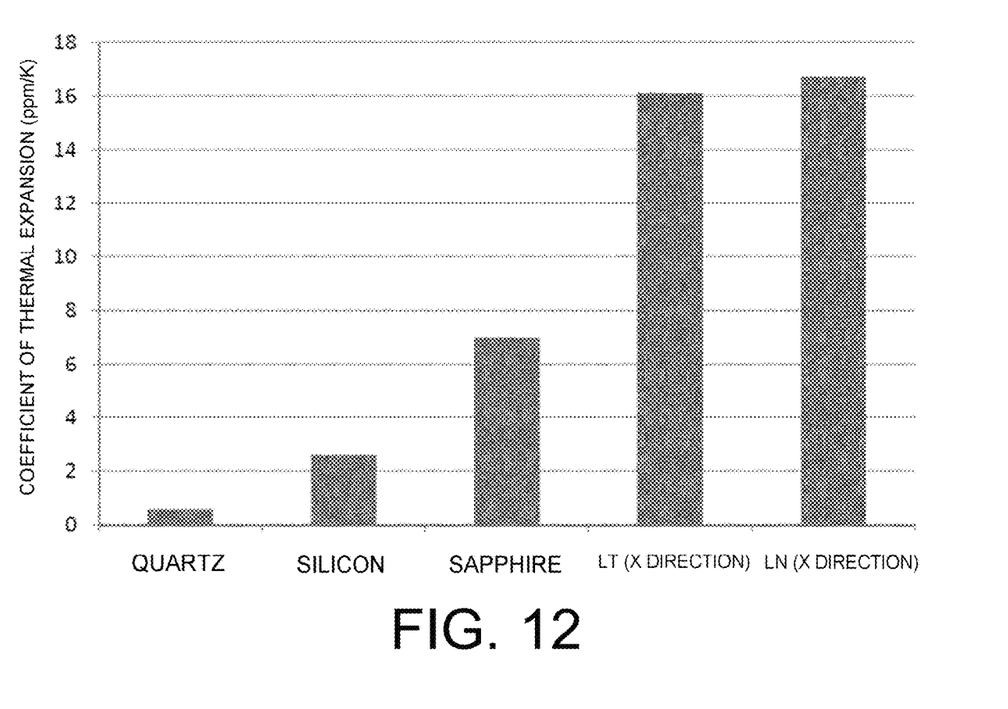
FIG. 12 shows coefficients of thermal expansion of diverse materials.

One method proposed to reduce this problem includes bonding a material having a low coefficient of thermal expansion to lithium tantalate ($LiTaO_3$: LT) or lithium niobate ($LiNbO_3$: LN) which is a piezoelectric material, and thinning the face of the piezoelectric material on which the material having a low coefficient of thermal expansion is not bonded to several micrometers to several tens micrometers by grinding or the like (Non Patent Document 1). In this method, by bonding the material having a low coefficient of thermal expansion (sapphire, silicon or the like) to LT or LN, thermal expansion of LT or LN is suppressed, and the temperature characteristics are improved. Graphs of coefficients of thermal expansion of diverse materials are shown in FIG. 12.

Figure 13:
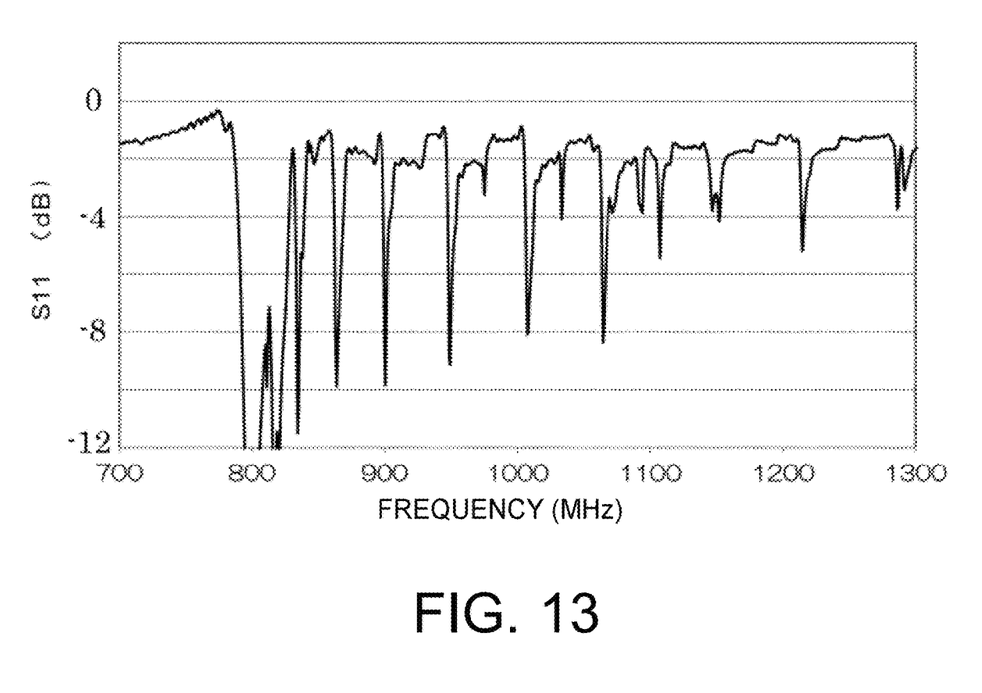
FIG. 13 illustrates one example of a reflection attenuation of a resonator formed on an LT film stacked on a silicon substrate.

However, this method leads another problem of occurrence of a noise called a spurious or ripple in the antiresonance frequency band as a result of stacking a thin LT film or LN film on the supporting substrate. This noise arises by reflection from the interface between the LT film or the LN film and the supporting substrate. A reflection attenuation (S11) of a resonator formed on an LT film stacked on a silicon substrate is shown in FIG. 13. FIG. 13 reveals that the waveform of the spurious alternately describes a peak and a bottom according to the variation in frequency. The difference between a peak and a bottom in a spurious waveform is called intensity (amplitude) of the spurious.

In order to solve this problem, several methods have been proposed in Reference Document 2. For example, there has been proposed a method including roughening the bonding surface of the LT with a grinding stone #1000 to give a roughness of 300 nm by $R_a$ value, and then bonding the LT and the supporting substrate together via an adhesive. However, since it is difficult to use an adhesive in an actual device from the view point of the reliability, a method of depositing an inorganic material such as $SiO_2$ in place of an adhesive followed by grinding has been proposed. However, it is difficult to process the unevenness to have a smoothness of atomic level that is durable to bonding (1 nm or less by $R_a$ value), and such a process is problematic from the aspect of cost.

PRIOR ART REFERENCES

Non Patent Document

Non Patent Document 1: TAIYO YUDEN CO., LTD. "Smartphone no RF frontend ni mochiirareru SAW-Duplexer no ondo hosyo gijutsu", Dempa Shimbun High Technology, November 2012 Non Patent Document 2: H. Kobayashi et al., "A study on Temperature-Compensated Hybrid Substrates for Surface Acoustic Wave Filters", IEEE International Ultrasonics Symposium, 2010, Vol. 1, p. 637-640

SUMMARY OF THE INVENTION

Problems to be Solved by the Invention

It is an object of the present invention to provide a method for producing a composite wafer capable of reducing a spurious arising by reflection of an incident signal on a joint interface between an LT film or the like and a supporting substrate in the composite wafer including a supporting substrate having a low coefficient of thermal expansion, and an LT film or LN film having a high coefficient of thermal expansion stacked on the supporting substrate.

Means for Solving the Problems (1) A method for producing a composite wafer of the present invention is a method for producing a composite wafer that produces a composite wafer by bonding a lithium tantalate wafer or a lithium niobate wafer (hereinafter, referred to as "stacking wafer") to a supporting wafer having a smaller coefficient of thermal expansion than the lithium tantalate wafer or the lithium niobate wafer, wherein prior to bonding together, an ion implanting step of implanting ions from a bonding surface of the stacking wafer and/or the supporting wafer, to disturb crystallinity near the respective bonding surfaces is executed. Accordingly, a signal incident from the stacking wafer which is a piezoelectric material is absorbed or scattered near an interface between the stacking wafer and the supporting wafer that are bonded together, and the reflection is suppressed, so that the spurious can be reduced.

(2) The ions implanted into each wafer can be a hydrogen ion (W), a hydrogen molecule ion ($H_2^+$), or a helium ion ($He^+$), and a dose amount may be $1.0 \times 10^{16}$ atoms/cm² or more and $1.0 \times 10^{17}$ atoms/cm² or less, $5.0 \times 10^{15}$ atoms/cm² or more and $5.0 \times 10^{16}$ atoms/cm² or less, or $1.0 \times 10^{16}$ atoms/cm² or more and $1.0 \times 10^{17}$ atoms/cm² or less, respectively. These light element ions are difficult to be restricted by the implanter because they can be implanted deeply into the wafer at a small acceleration voltage. In addition, by controlling the dose amount as described above, it is possible to improve the reflection suppressive effect, and to prevent the substrate from being damaged in a heat treatment performed after bonding together.

(3) After execution of the ion implanting step and prior to bonding together, a surface activation step of performing a surface activation treatment by an ozone water treatment, a UV ozone treatment, an ion beam treatment or a plasma treatment on a bonding surface of the stacking wafer and/or the supporting wafer may be executed. This makes atoms on the bonding surface of each wafer easily form a chemical bond, namely in an active state, and thus a firmer joint can be obtained.

(4) As a material of the supporting wafer, silicon or sapphire may be used. Since these materials have small coefficients of thermal expansion, heat expansion of the stacking wafer having a large coefficient of thermal expansion can be effectively suppressed, and temperature characteristics of the device can be improved.

(5) Prior to the ion implanting step, an insulating film formation step that forms an insulating film formed of $SiO_2$, SiON, or SiN on the bonding surface of the stacking wafer and/or the supporting wafer may be executed. By forming an insulating film and implanting ions through the insulating film, it is possible to suppress channeling of the implanted ions.

(6) The stacking wafer may have a lithium concentration increasing in the thickness direction toward the bonding surface. By employing a stacking wafer having such a concentration distribution, it is possible to reduce Dip appearing in the input impedance waveform when a resonator is formed on the wafer, for example.

DESCRIPTION OF EMBODIMENTS

Figure 1A:
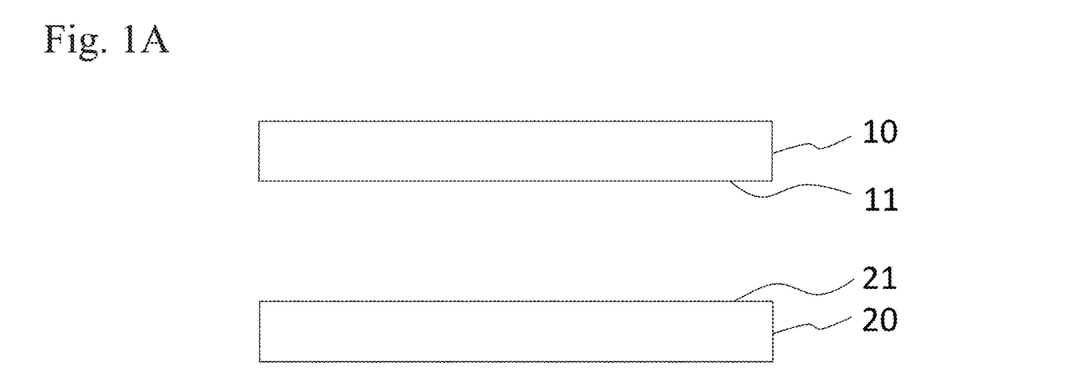
FIG. 1A to FIG. 1C illustrate an outline of a method for producing a composite wafer of the present invention.
Figure 1B:
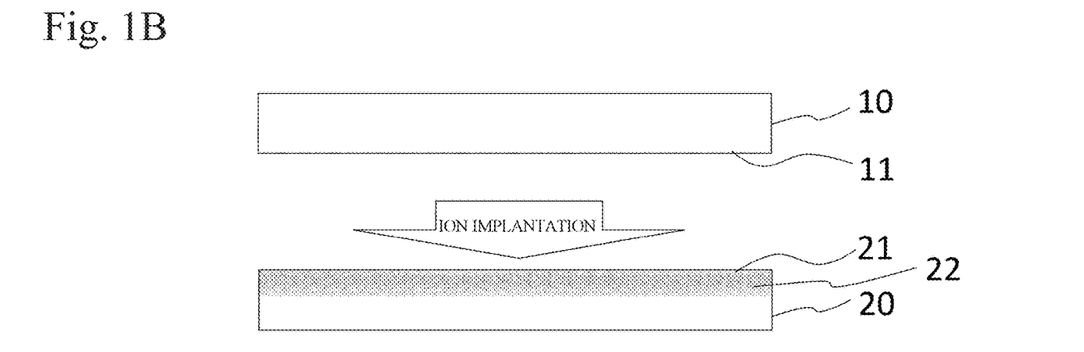
Figure 1C:
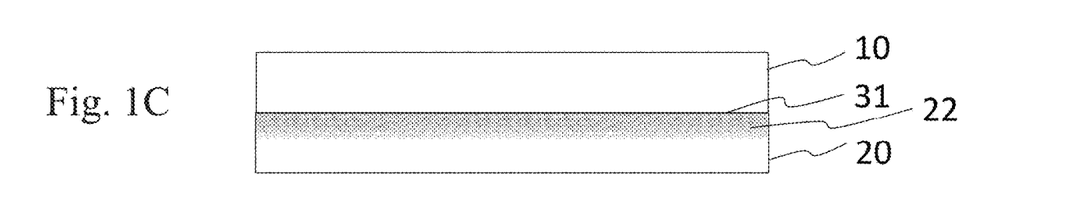

According to the present invention, in production of a composite wafer by bonding a lithium tantalate wafer or a lithium niobate wafer (stacking wafer) to a supporting wafer having a smaller coefficient of thermal expansion than the lithium tantalate wafer or the lithium niobate wafer, ions are implanted from a bonding surface of the stacking wafer and/or the supporting wafer, to disturb crystallinity near the respective bonding surfaces. That is, prior to bonding a stacking wafer 10 and a supporting wafer 20 as shown in FIG. 1A together at bonding surfaces 11, 21 as shown in FIG. 1C, ions are implanted from either one or both of the bonding surfaces (bonding surface 21 in FIG. 1B) to form an ion implanted region 22.

Accordingly, a signal incident from the stacking wafer 10 which is a piezoelectric material is absorbed or scattered near an interface 31 between the stacking wafer 10 and the supporting wafer 20 that are bonded together, and the reflection is suppressed, so that the spurious can be reduced.

The supporting wafer 20 is preferably formed of a material having a small coefficient of thermal expansion, such as silicon or sapphire that effectively suppresses thermal expansion of the stacking wafer 10 having a large coefficient of thermal expansion, and contributes to improvement in temperature characteristics of a SAW device formed on the stacking wafer 10. In addition, the stacking wafer 10 may have a lithium concentration increasing in the thickness direction toward the bonding surface. By employing a stacking wafer having such a concentration distribution, it is possible to reduce Dip appearing in the input impedance waveform when a resonator is formed on the wafer, for example.

Figure 2:
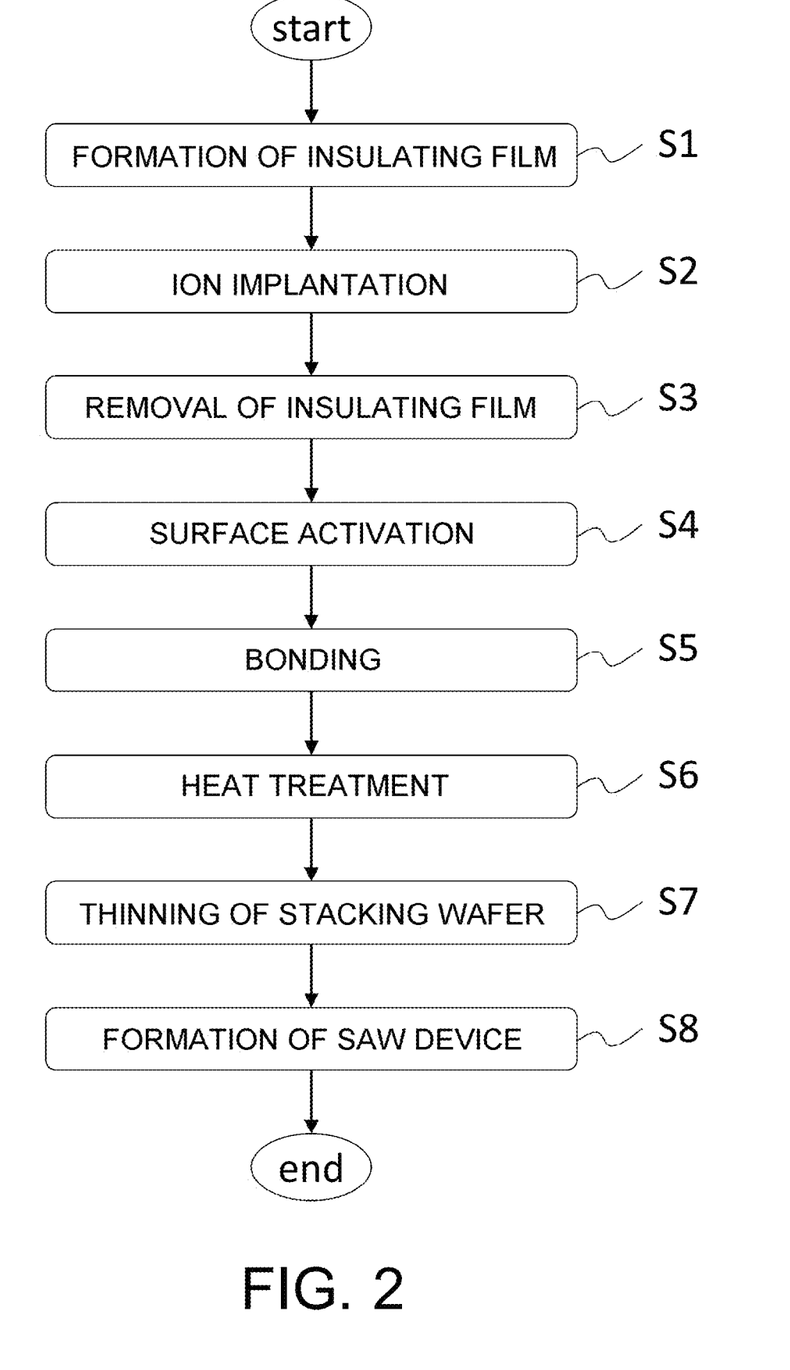
FIG. 2 illustrates one example of a production flow of a composite wafer of the present invention.

FIG. 2 illustrates one example of a specific production flow of a composite wafer of the present invention.

First, an insulating film is formed on a bonding surface of a wafer into which ions are to be implanted (S1). By forming an insulating film and implanting ions through the insulating film, it is possible to suppress channeling of the implanted ions. The insulating film is preferably formed of $SiO_2$, SiON, or SiN.

Then ions are implanted from the bonding surface of the wafer on which the insulating film is formed (S2). While any ions that disturb crystallinity can be implanted without limitation, light element ions that can be deeply implanted at a small acceleration voltage and less likely to be restricted by the implanter, for example, a hydrogen ion ($H^+$), a hydrogen molecule ion ($H_2^+$), and a helium ion ($He^+$) are preferred. While the reflection suppressive effect remarkably appears at a certain amount or more of the dose amount of ions, an excessive amount leads to destabilization of the joint at the bonding interface by the excessively existing elements, and causes a problem of damage of the substrate in the heat treatment step after the bonding. From this point of view, desired dose amounts are $1.0 \times 10^{16}$ atoms/cm$^2$ or more and $1.0 \times 10^{17}$ atoms/cm$^2$ or less in the case of a hydrogen ion, $5.0 \times 10^{15}$ atoms/cm$^2$ or more and $5.0 \times 10^{16}$ atoms/cm$^2$ or less in the case of a hydrogen molecule ion, and $1.0\times10^{16}$ atoms/cm$^2$ or more and $1.0\times10^{17}$ atoms/cm$^2$ or less in the case of a helium ion.

Then the insulating film is removed (S3), and a surface activation treatment is performed on the bonding surface of the wafer into which ions are implanted (S4). The surface activation treatment makes atoms on the bonding surface easily form a chemical bond, namely in an active state, and thus a firmer joint can be obtained. The surface activation treatment can be performed, for example, by an ozone water treatment, an UV ozone treatment, an ion beam treatment, or a plasma treatment.

Then wafers are bonded together on the bonding surface (S5), and a heat treatment is performed to prevent introduction of a crystal defect caused by slippage of the bonding interface (S6). Then after thinning the stacking wafer to a required degree by grinding and polishing (S7), an SAW device such as a resonator is formed (S8).

The present invention is not limited to the embodiments as described above. The above embodiments are illustrative, and any of those having a configuration that is substantially identical to the technical idea described in claims of the present invention, and having the same operation and effect are encompassed by the technical scope of the present invention.

EXAMPLES

Example 1

Figure 3:
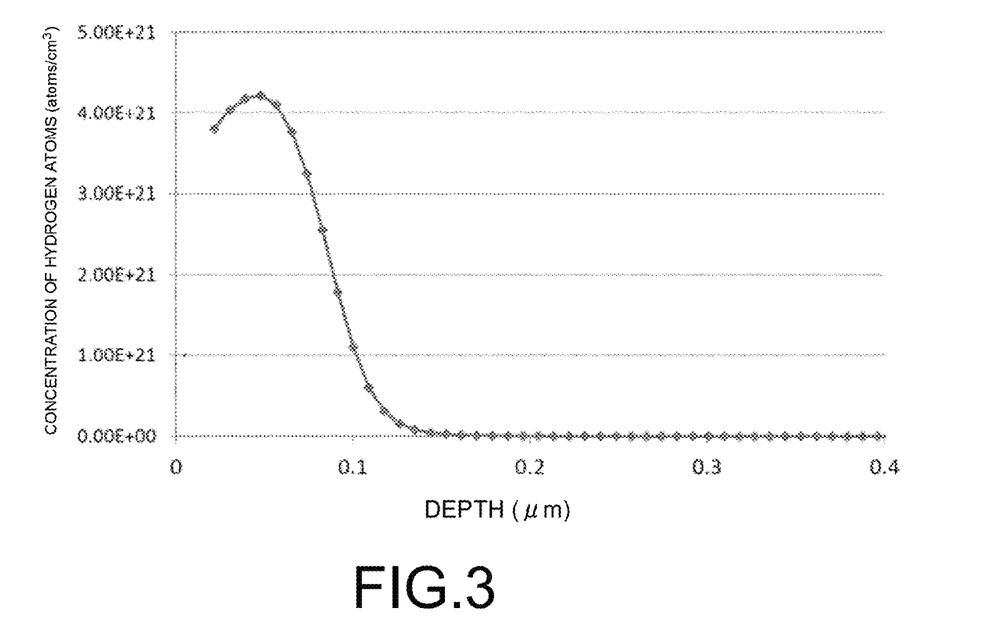
FIG. 3 illustrates one example of a concentration distribution of hydrogen atoms inside the silicon wafer in the depth direction from the bonding surface.

A silicon wafer having a diameter of 100 mm and a thickness of 0.55 mm was prepared and a thermal oxide film was grown to about 480 nm at a temperature of 1000° C. It was confirmed that both the lithium tantalate wafer (LT wafer) which is a stacking wafer and the silicon wafer which is a supporting wafer have a surface roughness of 1.0 nm or less by RMS. On the bonding surface of the silicon wafer, hydrogen molecule ions were implanted at an energy of 92 keV so that the dose amount was $2.0\times10^{16}$ atoms/cm$^2$. After implantation of ions, the thermal oxide film was removed with 10% hydrofluoric acid solution. The concentration distribution of hydrogen atoms inside the silicon wafer in the depth direction from the bonding surface is shown in FIG. 3. FIG. 3 reveals that the hydrogen concentration is high near the bonding surface.

These wafers were subjected to a surface activation by a plasma activation treatment, and then bonded together. After bonding together, a heat treatment at 120° C. for 6 hours was performed, and then the LT wafer was thinned to 20 μm by grinding and polishing. On this wafer, a single-stage ladder filter composed of a set of one parallel resonator and one serial resonator was made. The single-stage ladder filter had a wavelength of 5 μm.

For comparison, a single-stage ladder filter was prepared in the same manner as described above except that ions were not implanted into the silicon wafer.

Figure 4:
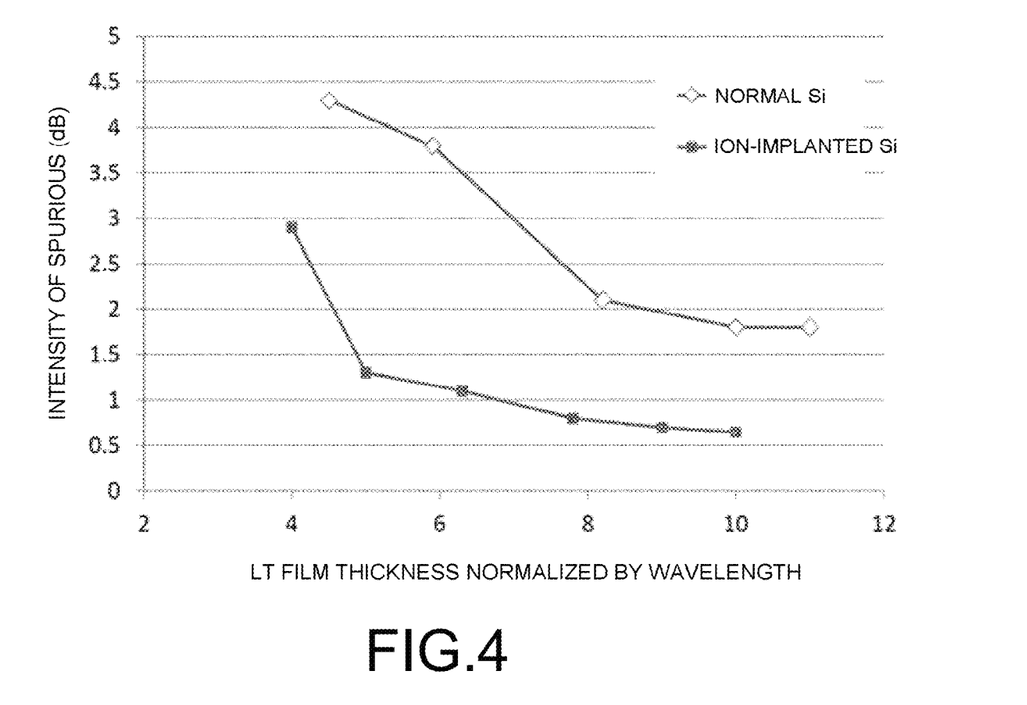
FIG. 4 illustrates comparison of spurious intensity between the case where ions are not implanted into the silicon wafer, and the case where ions are implanted into the silicon wafer.

The result of comparison is shown in FIG. 4. The vertical axis indicates an intensity (dB) of the spurious in S11 characteristics of the single-stage ladder filter, and the horizontal axis indicates a normalized LT film thickness (LT film thickness/wavelength) that is commonly used for evaluation of characteristics of a single-stage ladder filter. FIG. 4 reveals that the intensity of the spurious is largely reduced in the case where the silicon wafer into which ions are implanted is used as a supporting wafer, compared with the case where ions are not implanted.

Example 2

The same test was conducted while the surface activation treatment in Example 1 was changed to a vacuum ion beam activation, activation by ozone water treatment, or activation by UV ozone treatment, respectively. The difference in the result from that of Example 1 was within the margin of error, and it was confirmed that the same effect was obtained by any treatment method.

Example 3

A test was conducted for the case where implantation of ions was performed by using a hydrogen atom as an ion species to be implanted, an implanting energy of 46 KeV (half of that in Example 1), and a dose amount of $4\times10^{16}$ atoms/cm$^2$ in Example 1. The difference in the result from that of Example 1 was within the margin of error, and it was confirmed that the same effect was obtained by implantation of hydrogen ions.

Example 4

Figure 5:
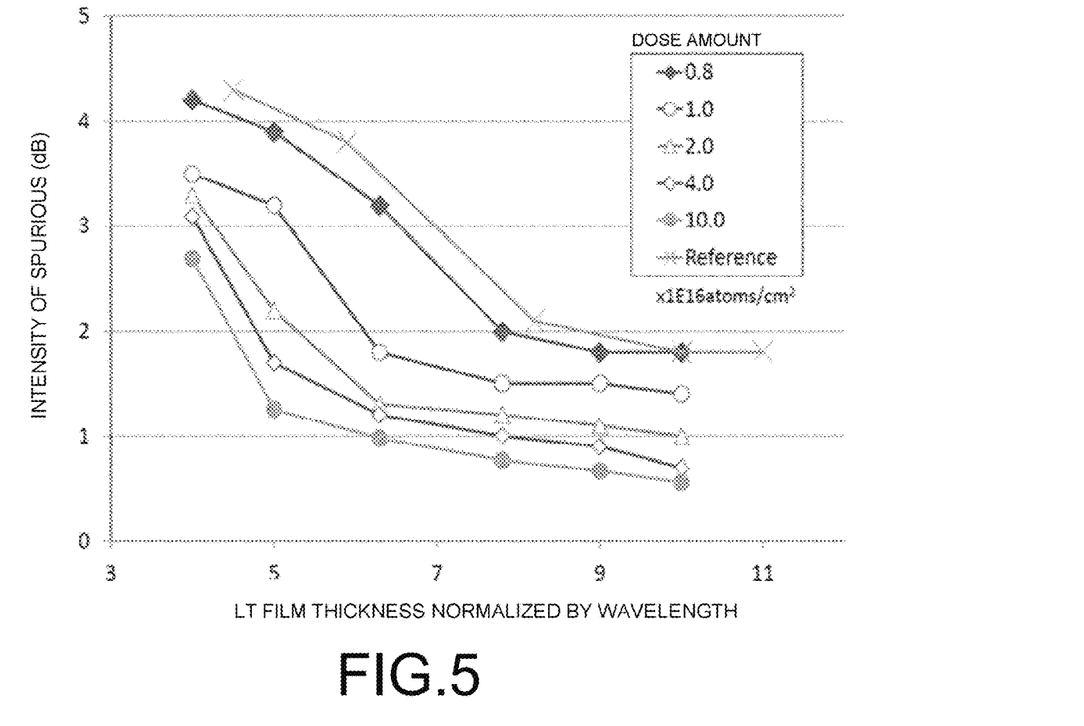
FIG. 5 illustrates the relationship between the ion dose amount to the silicon wafer and the spurious intensity.

A test for examining the spurious intensity was conducted when a hydrogen atom was selected as an ion species to be implanted, and a dose amount was varied within the range of $0.8\times10^{16}$ atoms/cm$^2$ to $1.0\times10^{17}$ atoms/cm$^2$ in Example 1. The result is shown in FIG. 5. Reference is the result in the case where implantation of ions is not performed. FIG. 5 reveals that the effect of implantation of ions becomes significant from the dose amount of $1.0\times10^{16}$ atoms/cm$^2$. While the test was conducted for the case where the dose amount was $1.0\times10^{17}$ atoms/cm$^2$ or more, the bonded substrate was broken in the stage of the heat treatment after bonding. This is attributable to the fact that the excessively existing hydrogen destabilized the joint in the bonding interface.

Example 5

A test was conducted for the case where the oxide film on the silicon was not removed after implantation of ions in Example 1. The difference in the result from that of Example 1 was within the margin of error, and it was confirmed that the same effect was obtained regardless of the presence or absence of an oxide film.

Example 6

A test was conducted for the case where a SiN film deposited by an LPCVD method or a SiON film deposited by a PECVD method was formed in place of a thermal oxide film, and bonding was performed while the film was left after implantation of ions in Example 1. The difference in the result from that of Example 1 was within the margin of error, and it was confirmed that the same effect was obtained regardless of the presence or absence of an oxide film.

Example 7

Figure 6:
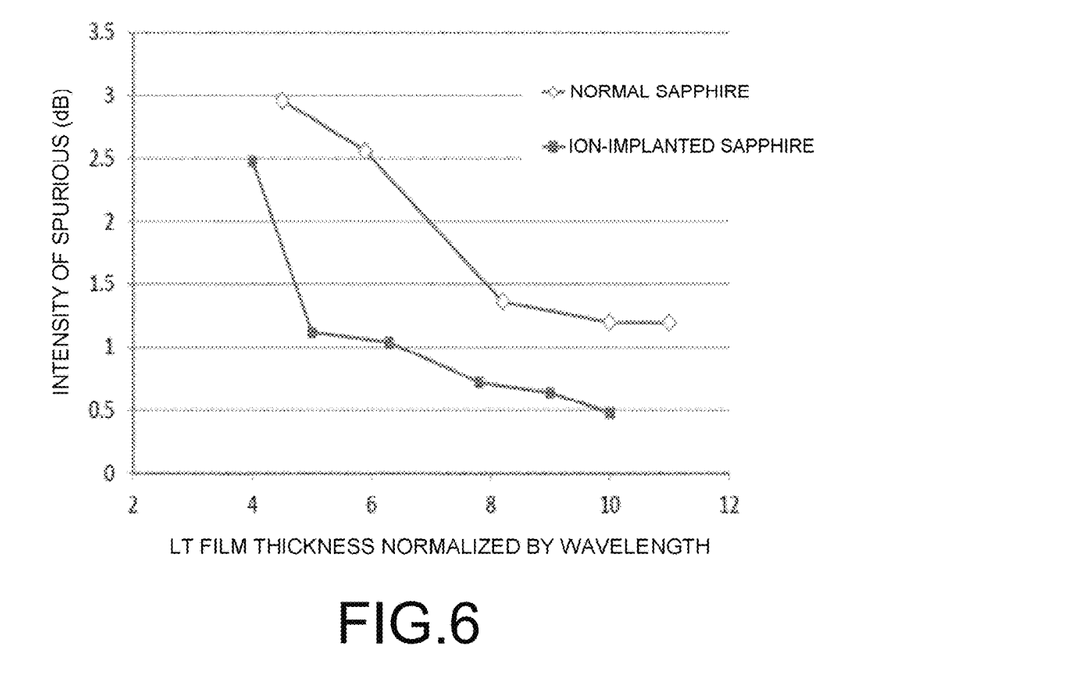
FIG. 6 illustrates comparison of spurious intensity between the case where ions are not implanted into the sapphire wafer, and the case where ions are implanted into the sapphire wafer.

The same test was conducted by using a sapphire wafer lacking an oxide film or the like, in place of the silicon wafer in Example 1. The result is shown in FIG. 6. FIG. 6 revealed that in the case of the sapphire wafer, the effect is obtained although the spurious reducing effect is reduced compared with the case of the silicon wafer.

Example 8

Implantation of ions was performed for the LT wafer in place of the silicon wafer and bonding was performed in Example 1 (the remaining conditions are the same). The difference in the result from that of Example 1 was within the margin of error, and it was confirmed that the same effect was obtained regardless of whether implantation of ions was performed for the silicon wafer or for the LT wafer.

Example 9

Figure 7:
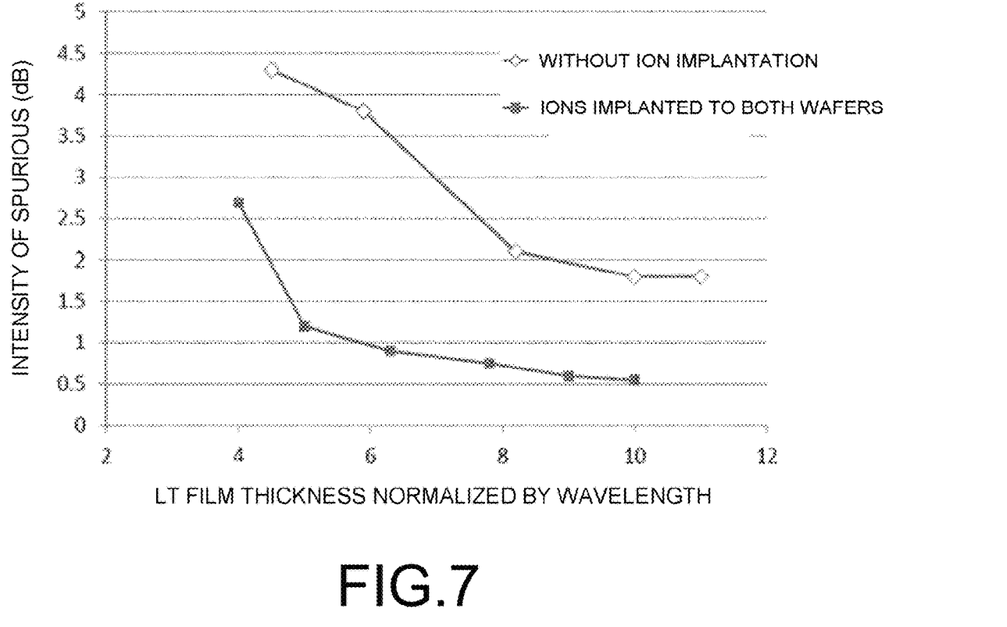
FIG. 7 illustrates comparison of spurious intensity between the case where ions are not implanted into the silicon wafer and the LT wafer, and the case where ions are implanted into the silicon wafer and the LT wafer.

Implantation of ions was performed both for the silicon wafer and the LT wafer and bonding was performed in Example 1 (the remaining conditions are the same). The result is shown in FIG. 7. FIG. 7 reveals that the spurious reducing effect is slightly larger as compared with the case where implantation of ions was performed either one of the wafers. In other words, it was confirmed that the same or higher effect is obtained by performing implantation of ions for both of the silicon wafer and the LT wafer, compared with the case of performing implantation of ions for either one of the wafers.

Example 10

A test was conducted for the case where helium ions were implanted in place of hydrogen ions in Example 1. The dose amount was $4 \times 10^{16}$ atoms/cm$^2$, and the acceleration voltage was 140 KeV. The difference in the result from that of Example 1 was within the margin of error, and it was confirmed that the same effect was obtained by implantation of helium ions.

Example 11

A silicon wafer having a diameter of 100 mm and a thickness of 0.55 mm was prepared and a thermal oxide film was grown to about 480 nm at a temperature of 1000° C. It was confirmed that both the lithium tantalate wafer (LT wafer) which is a stacking wafer and the silicon wafer which is a supporting wafer have a surface roughness of 1.0 nm or less by RMS. On the bonding surface of the silicon wafer, hydrogen molecule ions were implanted at an energy of 92 KeV so that the dose amount was $2.0 \times 10^{16}$ atoms/cm$^2$. After implantation of ions, the oxide film was removed with 10% hydrofluoric acid solution. The concentration distribution of hydrogen atoms inside the silicon in the depth direction from the bonding surface is shown in FIG. 3. FIG. 3 reveals that the hydrogen concentration is high near the bonding surface.

These wafers were subjected to a surface activation by a plasma activation treatment, and then bonded together. After bonding together, a heat treatment at 120° C. for 6 hours was performed, and then the LT wafer was thinned to 45 μm by grinding and polishing.

The LT wafer used above was prepared in the following manner. A LiTaO$_3$ single crystal ingot having a diameter of 4 inches and an approximately congruent composition of Li:Ta=48.3:51.7 was sliced, and a LiTaO$_3$ substrate of 46.3° rotational Y cut was cut out into a thickness of 370 μm. Then, the surface roughness of each slice wafer was adjusted to an arithmetic mean roughness Ra of 0.15 μm by a lap step as needed, to have a finished thickness of 350 μm.

Then, a substrate having a front face and a back face that were finished by surface grinding into quasi mirror faces having a Ra of 0.01 μm was embedded in a Li$_3$TaO$_4$-based powder composed of Li, Ta, and O. At this time, as the Li$_3$TaO$_4$-based powder, a powder obtained by mixing Li$_3$TaO$_4$ powder and Ta$_2$O$_5$ powder in a Li$_3$TaO$_4$:Ta$_2$O$_5$ molar ratio of 7:3, and baking at 1300° C. for 12 hours was used. Then, the Li$_3$TaO$_4$-based powder was spread all over a small container, and a plurality of slice wafers were embedded in the Li$_3$TaO$_4$ powder.

Then the small container was placed in an electric furnace, inside of which furnace was rendered a N$_2$ atmosphere, and heating at 900° C. for 24 hours was carried out to make Li diffuse toward the center part from the surface of the slice wafer. Then, in the temperature lowering process of this treatment, an annealing treatment was carried out at 800° C. for 12 hours in air atmosphere, and during temperatures of 770° C. to 500° C. in the process of further lowering the temperature of the wafer, an electric field of 4000 V/m was applied in the approximately +Z axial direction, and then a treatment of lowering the temperature to room temperature was carried out.

After this treatment, the rough surface side was finished to have an Ra value of about 0.15 μm by sand blasting, and the approximate mirror surface side was finished by polishing of 3 μm, and thus a multilayer LiTaO$_3$ single crystal substrate was prepared.

Figure 8:
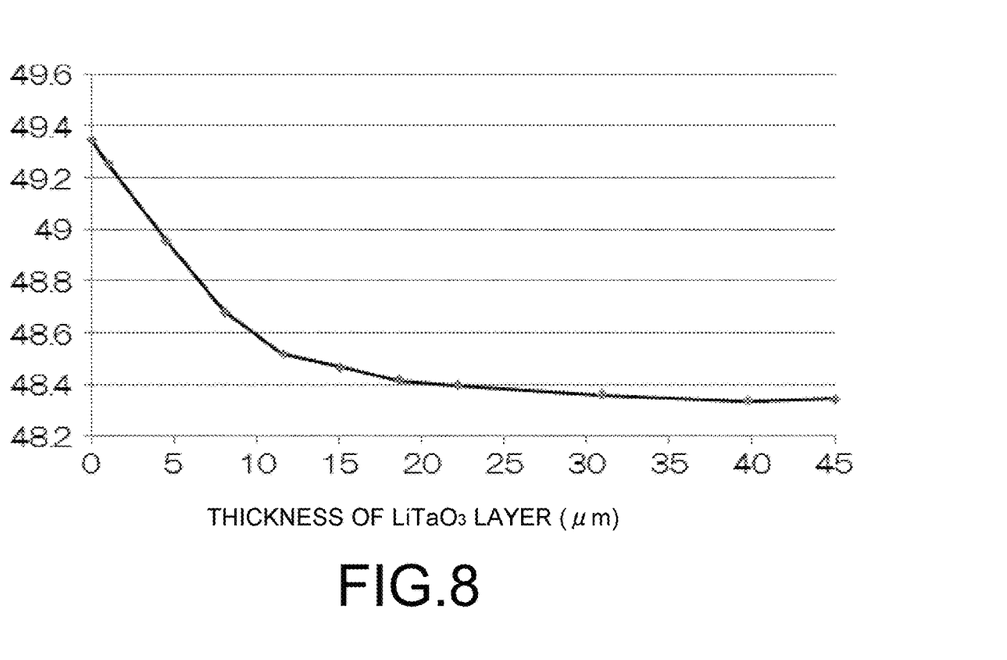
FIG. 8 illustrates one example of a profile in the thickness direction of Li concentration of the LT wafer.

FIG. 8 illustrates a profile in the thickness direction of Li concentration of the LT wafer prepared as described above. The thickness indicates the depth from 0 μm which is the bonding surface. FIG. 8 reveals that Li concentration of the LT wafer is highest at the bonding surface, and the concentration decreases as the depth increases.

For comparison, a composite wafer was prepared in the same manner for a LiTaO$_3$ single crystal substrate that was not subjected to a treatment in the Li$_3$TaO$_4$ powder and had no variation in Li concentration in the thickness direction.

Figure 9:
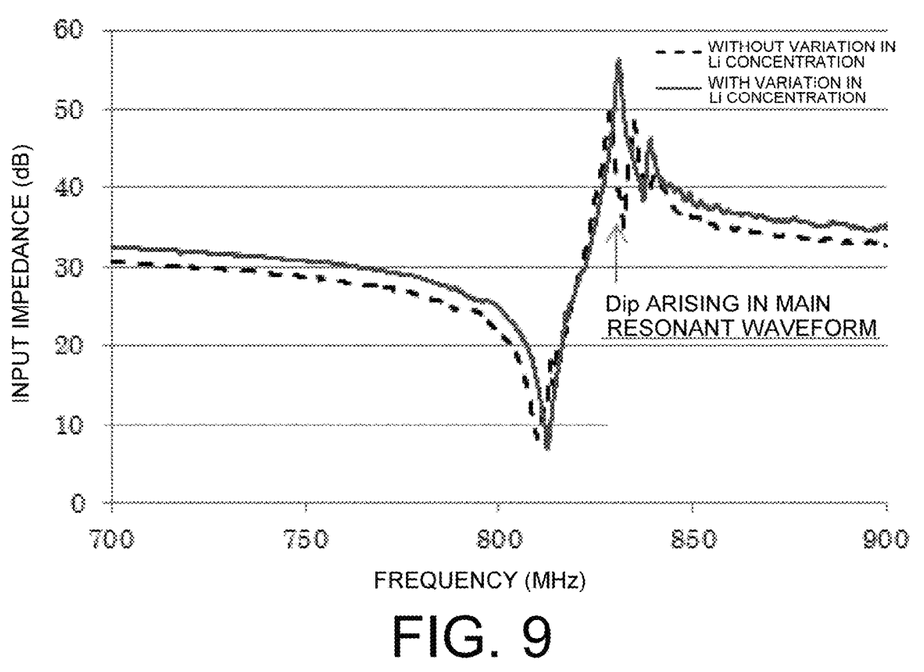
FIG. 9 illustrates comparison of input impedance waveform between the resonator provided on a composite wafer prepared with an LT wafer having no variation in Li concentration in the thickness direction, and a resonator provided on a composite wafer prepared with an LT wafer having variation in Li concentration in the thickness direction.

For each of the composite wafer prepared with the LT wafer having variation in Li concentration in the thickness direction as described above, and the composite wafer prepared with the LT wafer having no variation in Li concentration in the thickness direction, a resonator having a wavelength of 5 μm was formed on the composite wafer. FIG. 9 shows an input impedance waveform (main resonant enlarged waveform) of each resonator. It is revealed that the case where the Li concentration varies in the thickness direction as described above is preferable compared with the case where the Li concentration does not distribute in the thickness direction because Dip on the main resonant waveform is small.

Figure 10:
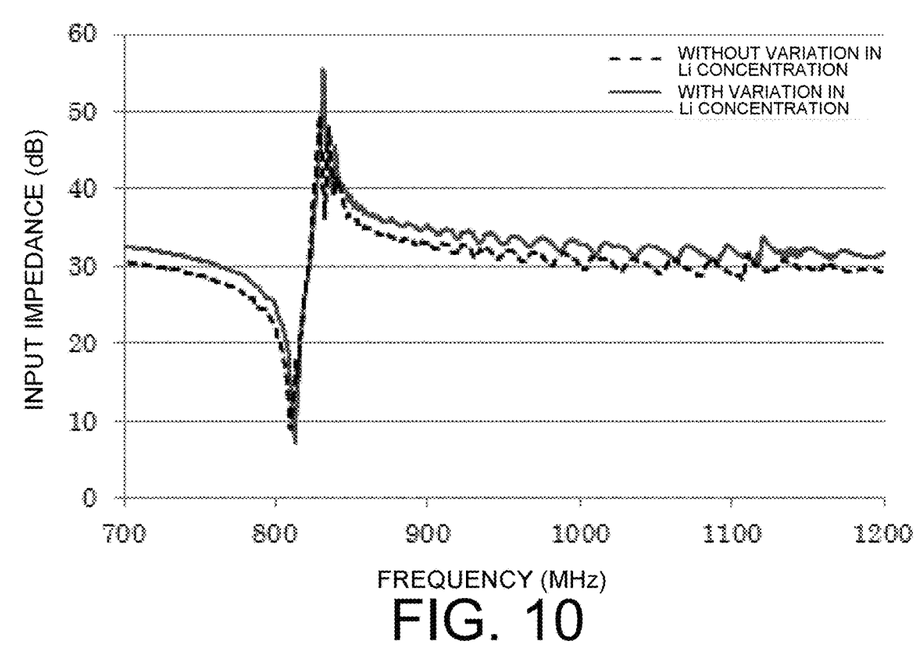
FIG. 10 illustrates comparison of input impedance waveform between the resonator provided on a composite wafer prepared with an LT wafer having no variation in Li concentration in the thickness direction, and a resonator provided on a composite wafer prepared with an LT wafer having variation in Li concentration in the thickness direction.

FIG. 10 illustrates the frequency-input impedance characteristics shown in FIG. 9 for a broadened frequency range. FIG. 10 reveals that the spurious response at a frequency of 900 to 1200 MHz that is higher than the main resonant frequency shows little difference in amplitude between the case where the Li concentration varies in the thickness direction of the LT wafer as described above, and the case where the Li concentration does not vary in the thickness direction.

Figure 11:
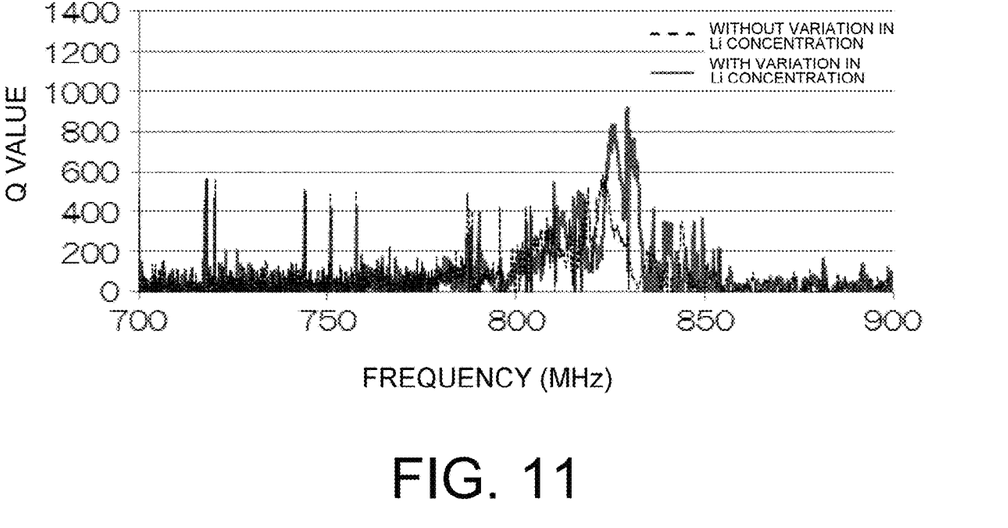
FIG. 11 illustrates comparison of Q value between the resonator provided on a composite wafer prepared with an LT wafer having no variation in Li concentration in the thickness direction, and a resonator provided on a composite wafer prepared with an LT wafer having variation in Li concentration in the thickness direction.

FIG. 11 shows Q values of the resonator. FIG. 11 reveals that the Q value is larger in the case where the Li concentration varies in the thickness direction of the LT wafer as described above, compared with the case where there is no distribution of Li concentration in the thickness direction. Therefore, when the Li concentration varies in the thickness direction of the LT wafer, the spurious of the main resonant frequency decreases and the Q value increases. Regarding the spurious response at a frequency higher than the main resonant frequency, almost the same results were obtained in the case where the Li concentration varies in the thickness direction of the LT wafer and in the case where the Li concentration does not vary in the thickness direction of the LT wafer.

The invention claimed is:

1. A method of producing a composite wafer, the method comprising:

a bonding step of bonding a stacking wafer, which is a lithium tantalate wafer or a lithium niobate wafer, to a supporting wafer to obtain the composite wafer, the supporting wafer having a smaller coefficient of thermal expansion than the lithium tantalate wafer or the lithium niobate wafer, wherein prior to the bonding step, the method further comprises an ion implanting step of implanting ions from a bonding surface of the supporting wafer into the supporting wafer, to disturb crystallinity near the bonding surface of the supporting wafer, wherein the stacking wafer is a layer on which a surface acoustic wave (SAW) device is to be formed, and wherein the method further comprises a step of thinning the stacking wafer in the composite wafer by grinding and polishing the stacking wafer.

2. The method according to claim 1, wherein the ions are hydrogen ions (H$^+$), and a dose amount is $1.0 \times 10^{16}$ atoms/cm$^2$ or more and $1.0 \times 10^{17}$ atoms/cm$^2$ or less.

3. The method according to claim 1, wherein the ions are hydrogen molecule ions (H$_2^+$), and a dose amount is $5.0 \times 10^{15}$ atoms/cm$^2$ or more and $5.0 \times 10^{16}$ atoms/cm$^2$ or less.

4. The method according to claim 1, wherein the ions are helium ions (He$^+$), and a dose amount is $1.0 \times 10^{16}$ atoms/cm$^2$ or more and $1.0 \times 10^{17}$ atoms/cm$^2$ or less.

5. The method according to claim 1, wherein after the ion implanting step and prior to the bonding step, the method further comprises a surface activation step for performing a surface activation treatment by an ozone water treatment, a UV ozone treatment, an ion beam treatment or a plasma treatment on the bonding surface of the supporting wafer.

6. The method according to claim 1, wherein the supporting wafer is formed of silicon or sapphire.

7. The method according to claim 1, wherein prior to the ion implanting step, the method further comprises an insulating film formation step of forming an insulating film formed of SiO$_2$, SiON, or SiN on the bonding surface of the supporting wafer.

8. The method according to claim 1, wherein the stacking wafer has a lithium concentration that increases in a thickness direction toward the bonding surface.

9. A method of producing a composite wafer from a stacking wafer, which is a lithium tantalate wafer or a lithium niobate wafer, and a supporting wafer having a smaller coefficient of thermal expansion than the lithium tantalate wafer or the lithium niobate wafer, the method comprising:

implanting ions from a bonding surface of the stacking wafer into the stacking wafer and forming an ion implanted region, to disturb crystallinity near the bonding surface of the stacking wafer;

after the implanting, bonding a bonding surface of the supporting wafer and the bonding surface of the stacking wafer together to form the composite wafer; and thinning the composite wafer by grinding and/or polishing the stacking wafer in the composite wafer.

10. The method according to claim 9, wherein the ions are hydrogen ions (H$^+$), and a dose amount is $1.0 \times 10^{16}$ atoms/cm$^2$ or more and $1.0 \times 10^{17}$ atoms/cm$^2$ or less.

11. The method according to claim 9, wherein the ions are hydrogen molecule ions (H$_2^+$), and a dose amount is $5.0 \times 10^{15}$ atoms/cm$^2$ or more and $5.0 \times 10^{16}$ atoms/cm$^2$ or less.

12. The method according to claim 9, wherein the ions are helium ions (He$^+$), and a dose amount is $1.0 \times 10^{16}$ atoms/cm$^2$ or more and $1.0 \times 10^{17}$ atoms/cm$^2$ or less.

13. The method according to claim 9, further comprising, after the implanting and prior to the bonding, performing a surface activation treatment by an ozone water treatment, a UV ozone treatment, an ion beam treatment or a plasma treatment on a bonding surface of the stacking wafer and/or the composite wafer.

14. The method according to claim 9, wherein the supporting wafer is formed of silicon or sapphire.

15. The method according to claim 9, further comprising, prior to the implanting, forming an insulating film formed of SiO$_2$, SiON, or SiN on the bonding surface of the stacking wafer and/or the composite wafer.

16. The method according to claim 9, wherein the stacking wafer has a lithium concentration that increases in a thickness direction toward the bonding surface.

* * * * *